(12) United States Patent
Seo et al.

(10) Patent No.: US 8,101,983 B2
(45) Date of Patent: Jan. 24, 2012

(54) NONVOLATILE MEMORY DEVICE COMPRISING ONE SWITCHING DEVICE AND ONE RESISTANT MATERIAL AND METHOD OF MANUFACTURING THE SAME

(75) Inventors: Sun-ae Seo, Seoul (KR); In-kyeong Yoo, Suwon-si (KR); Myoung-jae Lee, Suwon-si (KR); Wan-jun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/654,626

(22) Filed: Jan. 18, 2007

(65) Prior Publication Data

US 2007/0114587 A1 May 24, 2007

Related U.S. Application Data

(62) Division of application No. 10/852,287, filed on May 25, 2004.

(30) Foreign Application Priority Data

Jun. 3, 2003 (KR) .................. 10-2003-0035562

(51) Int. Cl.
*H01L 29/94* (2006.01)
(52) U.S. Cl. ........................ 257/295; 257/296
(58) Field of Classification Search .............. 257/312, 257/480, 314, E29.344, E29.17, 68–71, 296–309, 257/295, 315–326, E27.078, E29.3–E29.309, 257/E21.179–E21.182, E21.209–E21.21, 257/E21.422, E21.423, E21.679–E21.694; 338/20; 365/148; 357/314
See application file for complete search history.

(56) References Cited

U.S. PATENT DOCUMENTS

| | | | |
|---|---|---|---|
| 3,761,896 | A | 9/1973 | Davidson |
| 4,472,296 | A | 9/1984 | Hunter, Jr. et al. |
| 5,099,302 | A | 3/1992 | Pavlin |
| 5,640,343 | A | 6/1997 | Gallagher et al. |
| 5,751,012 | A | 5/1998 | Wolstenholme et al. |
| 6,151,241 | A | 11/2000 | Hayashi et al. |
| 6,358,756 | B1 | 3/2002 | Sandhu et al. |
| 6,436,757 | B1 | 8/2002 | Kitamura |

(Continued)

FOREIGN PATENT DOCUMENTS

CN 1340213 A 3/2002

(Continued)

OTHER PUBLICATIONS

European Search Report (in English) issued in corresponding European Patent Application No. 04 25 3135, May 16, 2006, EPO, Munich, DE.

(Continued)

*Primary Examiner* — Steven Loke
*Assistant Examiner* — Tram H Nguyen
(74) *Attorney, Agent, or Firm* — Harness, Dickey & Pierce, P.L.C.

(57) ABSTRACT

A nonvolatile memory device including one transistor and one resistant material and a method of manufacturing the nonvolatile memory device are provided. The nonvolatile memory device includes a substrate, a transistor formed on the substrate, and a data storage unit connected to a drain of the transistor. The data storage unit includes a data storage material layer having different resistance characteristics in different voltage ranges.

8 Claims, 4 Drawing Sheets

U.S. PATENT DOCUMENTS

| | | | |
|---|---|---|---|
| 6,487,110 | B2 | 11/2002 | Nishimura et al. |
| 6,522,573 | B2 | 2/2003 | Saito et al. |
| 6,590,244 | B2 | 7/2003 | Asao et al. |
| 6,815,744 | B1 | 11/2004 | Beck et al. |
| 6,816,404 | B2 * | 11/2004 | Khouri et al. ............... 365/163 |
| 7,924,138 | B2 * | 4/2011 | Kinoshita et al. ............. 338/20 |
| 2002/0036917 | A1 | 3/2002 | Nishimura et al. |
| 2002/0063274 | A1 * | 5/2002 | Kanaya et al. ............... 257/310 |
| 2002/0079526 | A1 | 6/2002 | Fukuda et al. |
| 2003/0048666 | A1 | 3/2003 | Eldridge et al. |
| 2003/0072195 | A1 | 4/2003 | Mikolajick |
| 2003/0096468 | A1 | 5/2003 | Soininen et al. |
| 2003/0123284 | A1 * | 7/2003 | Lowrey et al. ............... 365/175 |
| 2003/0156467 | A1 | 8/2003 | Gilton et al. |
| 2003/0156468 | A1 | 8/2003 | Campbell et al. |
| 2003/0189851 | A1 | 10/2003 | Brandenberger et al. |
| 2003/0209971 | A1 | 11/2003 | Kozicki |
| 2004/0037106 | A1 * | 2/2004 | Lu et al. ........................ 365/96 |
| 2004/0113137 | A1 * | 6/2004 | Lowrey ............................ 257/5 |
| 2004/0113192 | A1 * | 6/2004 | Wicker ......................... 257/298 |
| 2005/0009361 | A1 | 1/2005 | DeBoer et al. |
| 2005/0247921 | A1 | 11/2005 | Lee et al. |
| 2007/0132049 | A1 | 6/2007 | Stipe |
| 2007/0155117 | A1 * | 7/2007 | Wicker ......................... 438/409 |
| 2007/0200158 | A1 * | 8/2007 | Genrikh et al. ............... 257/306 |

FOREIGN PATENT DOCUMENTS

| | | | |
|---|---|---|---|
| CN | 1450561 A | 10/2003 | |
| EP | 1 179 837 | 2/2002 | |
| EP | 1 355 356 A2 | 10/2003 | |
| EP | 1 484 799 | 12/2004 | |
| JP | 62-042582 A | 2/1987 | |
| JP | A-63-226981 | 9/1988 | |
| JP | 02-058264 | 2/1990 | |
| JP | 06-509909 | 11/1994 | |
| JP | 2002-537627 | 11/2002 | |
| KR | 1019950021133 | 7/1995 | |
| KR | 1020030034500 A | 5/2003 | |
| KR | 1020040055594 | 6/2004 | |
| KR | 1020040104967 | 12/2004 | |
| WO | WO 94/24707 | 10/1994 | |
| WO | WO 00/47797 | 8/2000 | |
| WO | WO/00/49659 | * 8/2000 | .................... 257/295 |
| WO | WO00/49659 | * 8/2000 | .................... 257/295 |
| WO | WO 00/49659 | 8/2000 | |
| WO | WO0049659 | * 8/2000 | .................... 257/295 |
| WO | WO 03/028124 | 4/2003 | |

OTHER PUBLICATIONS

Jansen, R., et al., "Influence of barrier impurities on the magnetoresistance in ferromagnetic tunnel junctions", Journal of Applied Physics, Jun. 1, 1998, pp. 6682-6684, vol. 83, No. 11, American Institute of Physics, NY, USA.
Communication Pursuant to Article 96(2) EPC issued in corresponding European Patent Application No. 04 253 135, Apr. 23, 2007, cover sheet and pp. 1-2, EPO, Munich, DE.
*Chinese Office Action dated Feb. 9, 2007 and English translation.
Korean Office Action dated Jun. 26, 2007 (with English Translation).
Chinese Official Action dated Oct. 18, 2007 (with English translation).
Office Action for U.S. Appl. No. 10/852,287 (US 2004/0245557 A1), dated Nov. 29, 2007.
Office Action for U.S. Appl. No. 11/116,332 (US 2005/0247921 A1), dated Dec. 4, 2007.
Chinese Office Action for Application No. 2005100684384, dated Mar. 21, 2008 and its English translation.
European Patent Office Action dated May 8, 2008 for European Patent Application No. 04 253 135.0-2222.
Japanese Office Action and English translation dated Oct. 19, 2009.
European Search Report dated Jun. 6, 2008.
Korean Office Action and English translation dated Jul. 11, 2006.
U.S. Office Action dated Mar. 3, 2010 for co-pending U.S. Appl. No. 11/295,551.
European Search Report dated Feb. 12, 2010.
Office Action from corresponding European application No. 04253135.0, mailed on May 5, 2008.

* cited by examiner $V_{W2} > V_2 > V_{E2} > V_1 > V_{R3} = V_{R4}$

US 8,101,983 B2

NONVOLATILE MEMORY DEVICE COMPRISING ONE SWITCHING DEVICE AND ONE RESISTANT MATERIAL AND METHOD OF MANUFACTURING THE SAME

BACKGROUND OF THE INVENTION

This application claims the priority of Korean Patent Application NO. 2003-35562, filed on Jun. 3, 2003, in the Korean Intellectual Property Office, the disclosure of which is incorporated herein in its entirety by reference. This application is a divisional of application Ser. No. 10/852,287, filed on May 25, 2004.

1. Field of the Invention

The present invention relates to a nonvolatile memory, and more particularly, to a nonvolatile memory device comprising one transistor and one resistant material in which data is written and a method of manufacturing the nonvolatile memory device.

2. Description of the Related Art

An example of a conventional memory device that consists of one transistor and one resistant material (hereinafter 1T-1R) is a parameter random access memory (PRAM).

The resistant material used in the PRAM is a calcogenide material. The calcogenide material may be in an amorphous or crystalline state depending on a manufacturing temperature. The resistance of the calcogenide material is high when it is amorphous and is low when it is crystalline.

The PRAM is a nonvolatile memory device that reads and writes data by changing the state of the calcogenide resistant material.

It is difficult to etch a conventional nonvolatile memory device, for example, the PRAM, by a conventional DRAM process using a resistant material having an excellent anti-etching property. Even if the nonvolatile memory device can be etched by the DRAM process, it takes a considerable amount of time. Thus, in the case of the conventional nonvolatile memory device including 1T-1R, manufacturing costs increase due to low productivity and thus a competitive edge of the product cannot be obtained.

SUMMARY OF THE INVENTION

The present invention provides a nonvolatile memory device having one switching device, for example, a transistor (Tr) or diode, and one resistant material, and a method of manufacturing the nonvolatile memory device which can be mass produced at lower production costs. A memory characteristic of the resistant material does not directly influence the degree of integration of the memory device.

According to an aspect of the present invention, there is provided a nonvolatile memory device comprising a transistor and a data storage unit connected to a drain of the transistor, wherein the data storage unit includes a data storage material layer. The data storage material layer shows a first resistance characteristic in a first voltage range and a second resistance characteristic in a second voltage range. The first voltage range differs from the second voltage range, and the first resistance characteristic differs from the second resistance characteristic.

An upper electrode and a lower electrode may be formed on the upper and lower surfaces of the data storage material layer, respectively.

An interlayer insulating layer may be formed between the lower electrode and the substrate, a contact hole that exposes the drain is formed in the interlayer insulating layer, and the contact hole may be filled with a conductive plug.

The data storage material layer may be a transition metal oxide layer whose resistance dramatically increases in a predetermined voltage range.

According to another aspect of the present invention, there is provided a nonvolatile memory device comprising a diode with a switching function and a data storage unit connected to the diode, wherein the data storage unit includes a data storage material layer, which is the same in the above description.

According to still another aspect of the present invention, there is provided a method of manufacturing a nonvolatile memory device comprising a substrate, a transition formed on the substrate, and a data storage unit connected to a drain of the transistor, the method comprising: sequentially forming a lower electrode, a data storage material layer, and an upper electrode to form the data storage unit, wherein the data storage material layer is formed of a material layer having different resistance characteristics in different voltage ranges.

The material layer may be formed of a transition metal oxide layer whose resistance dramatically increases in the voltage range.

According to still another aspect of the present invention, there is provided a method of manufacturing a nonvolatile memory device comprising: forming a diode on a substrate; and forming a data storage unit connected to the diode on the substrate, wherein the data storage unit is formed by sequentially forming a lower electrode connected to the diode, a data storage material layer, and an upper electrode.

The data storage material layer may be formed of a material layer having different resistance characteristics in different voltage ranges. The data storage material layer is the same as described above.

As a result, according to certain embodiments of the present invention, the conventional DRAM manufacturing process can be used since the transition metal oxide layer is used as the resistant material. Thus, productivity increases and production costs are lowered. Moreover, the memory characteristic of the resistant material does not change, even though its size is reduced due to higher integration density, since the data is read and written using changes in resistance of the resistant material. Additionally, since data written to the resistant material layer can be non-destructively read, the resistant material remains in the same state as before data reading, and an operation voltage is lowered. Thus, after data is read, a restoring process is not required.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
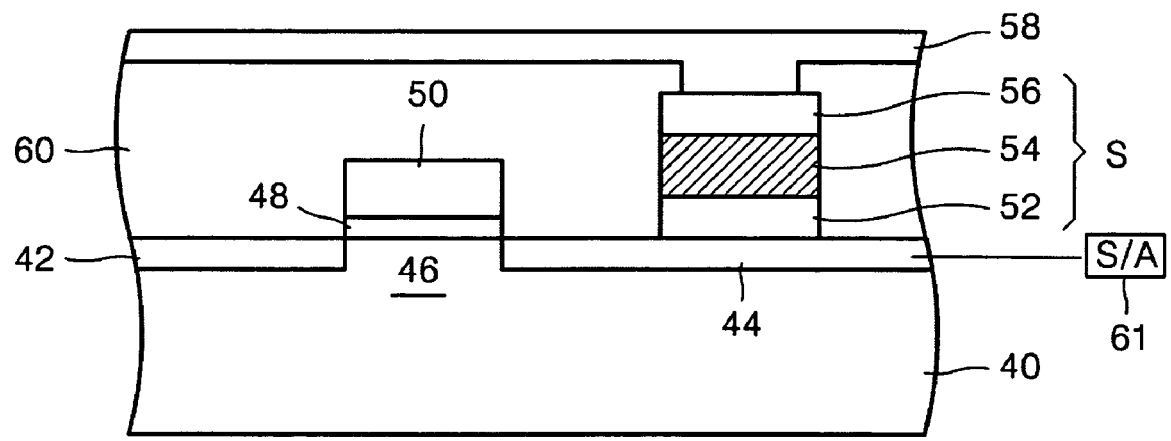
FIG. 1 is a cross-section of a nonvolatile memory device according to an embodiment of the present invention.

The present invention will now be described more fully with reference to the attached drawings, in which exemplary embodiments thereof are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the forms of elements are exaggerated for clarity. To facilitate understanding, identical reference numerals have been used for like elements throughout the figures.

FIG. 1 is a cross-section of a nonvolatile memory device according to an embodiment of the present invention.

Referring to FIG. 1, a nonvolatile memory device having one transistor and one resistant material includes a substrate 40, a transistor which is formed on the substrate 40, and a data storage unit S which is connected to a portion of the transistor. The transistor is formed on an upper surface of the substrate 40 and includes a source 42 and a drain 44 doped with conductive impurities, and gate stacking materials 48 and 50 on a channel 46 between the source 42 and the drain 44. The gate stacking materials 48 and 50 consist of a gate insulating layer 48 and a gate electrode 50. The data storage unit S is formed on the drain 44. The data storage unit S includes a lower electrode 52 directly contacting the drain 44, a data storage material layer 54 stacked on the lower electrode 52, and an upper electrode 56 stacked on the data storage material layer 54. The data storage material layer 54 is a variable resistant material layer in which resistance is changed according to a size and direction of voltage or current pulse. The variable resistant material layer that can be used as the data storage material 54, is preferable to be a transition metal oxide layer such as $NiO$, $V_2O_5$, $ZnO$, $Nb_2O_5$, $TiO_2$, $WO_3$, $CoO$ layers etc.

The transition metal oxide layer has a noticeable characteristic. That is, if a specific voltage or current value is applied to the transition metal oxide layer and thus the transition metal oxide layer has the specific value, the transition metal oxide layer maintains the specific value until a new specific value is applied. This characteristic of the transition metal oxide layer will be explained in detail later.

An interlayer insulating layer 60 covering the transistor surrounding the data storage unit S is formed on the substrate 40. A section of the interlayer insulating layer 60 formed on the upper electrode 56 is removed to expose an upper surface of the upper electrode 56. A plate electrode 58, which is stacked on the interlayer insulating layer 60, is connected to the front of the exposed surface of the upper electrode 56. The plate electrode 58 and the upper electrode 56 may be formed of the same material.

A current amplifier 61 is connected to the drain 44 and senses and amplifies a drain current Id.

Figure 2:
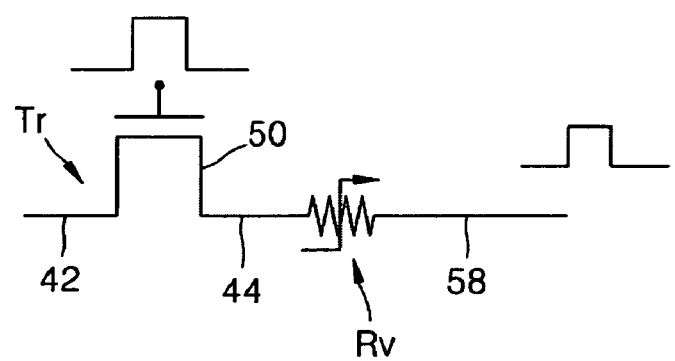
FIG. 2 is a circuit diagram of the nonvolatile memory device of FIG. 1.

FIG. 2 is a circuit diagram of the nonvolatile memory device of FIG. 1. In FIG. 2, Tr denotes the transistor, and Rv denotes a changeable resistant material corresponding to the data storage material layer 54.

Figure 3:
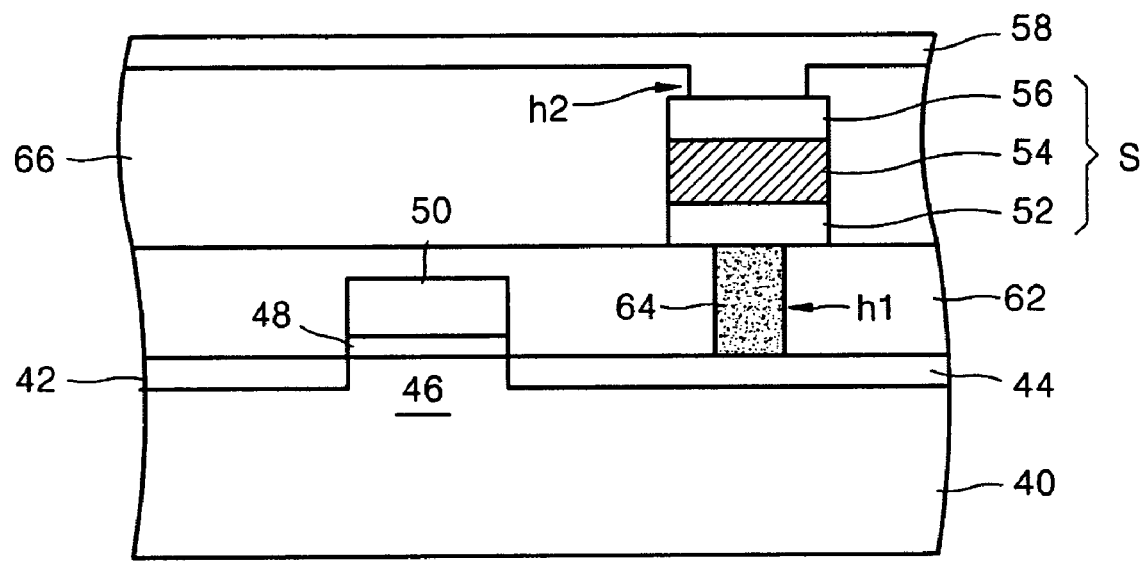
FIG. 3 is a cross-sectional view illustrating a variation of the non-memory device shown in FIG. 1 according to the present invention.

FIG. 3 is a cross-sectional view of a variation of the nonvolatile memory device shown in FIG. 1 according to the present invention.

Referring to FIG. 3, a first interlayer insulating layer 62 covering a source 42, gate stacking materials 48 and 50, and a drain 44 is formed on a substrate 40 and has a flat upper surface. A contact hole h1 is formed in the first interlayer insulating layer 62. The drain 44 is exposed through the contact hole h1. The contact hole h1 is filled with a conductive plug 64. The data storage unit S is formed on the first interlayer insulating layer 62 covering the conductive plug 64. A second interlayer insulating layer 66 covering the data storage unit S is formed on the first interlayer insulating layer 62. A via hole h2 is formed in the second interlayer insulating 66 such that the upper electrode 56 of the data storage unit S is exposed. where an upper electrode 56 of the data storage unit S is exposed. A plate electrode 58 filling the via hole h2 is formed on the second interlayer insulating layer 66.

The elements of the data storage unit S may not be a stacked type.

For instance, the lower electrode 52 of the data storage unit S may have a cylindrical shape and the data storage material layer 54 may be formed on the surface of the lower electrode 52. Or the lower electrode 52 may be a columnar shape and the data storage material layer 54 may be formed on the upper surface of the lower electrode 52.

Next, characteristics of the data storage unit S of the nonvolatile memory device will be explained with reference to FIGS. 4 and 5.

Figure 4:
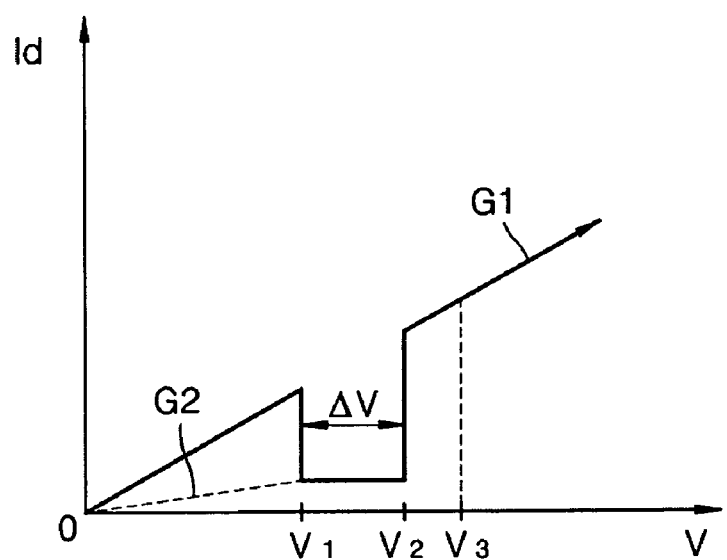
FIG. 4 is a graph illustrating voltage-current characteristics when a data storage material layer is an NiO layer in the nonvolatile memory device of FIG. 1.
Figure 5:
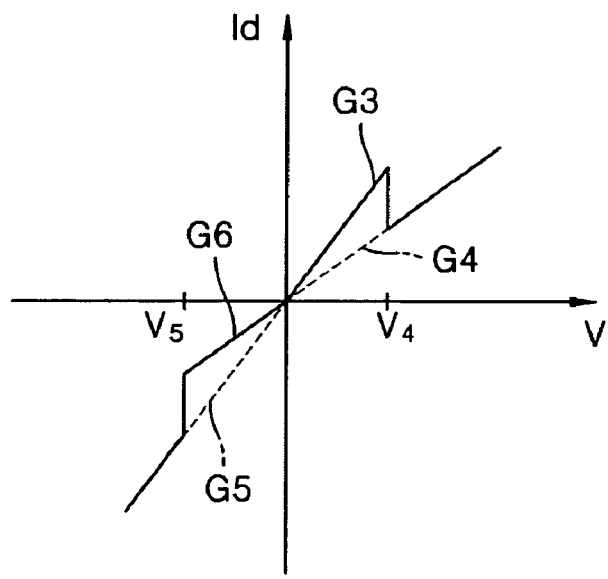
FIG. 5 is a graph illustrating voltage-current characteristics when a data storage material layer is a $TiO_2$ layer in the nonvolatile memory device of FIG. 1.

FIG. 4 is a graph illustrating current-voltage characteristic of the data storage unit S when the data storage material layer 54 is an NiO layer and FIG. 5 is a graph illustrating current-voltage characteristic of the data storage unit S when the data storage material layer 54 is a $TiO_2$ layer.

Referring to FIGS. 4 and 5, a horizontal axis indicates a voltage applied to the data storage unit S and a vertical axis indicates a drain current Id flowing between the source 42 and the drain 44.

A first graph G1 illustrates a case where the resistance of the data storage unit S, i.e., the resistance of the data storage material layer 54, is lowered, and a second graph G2 illustrates a case where the resistance of the data storage material layer 54 has an increased value.

Referring to the first graph G1, the drain current Id is changed in proportion to the voltage applied to the data storage material layer 54. However, when the voltage applied to the data storage material layer 54 reaches a first voltage $V_1$ ($V_1 > 0$), the resistance of the data storage material layer 54 suddenly increases and the drain current Id of the data storage material layer 54 is dramatically reduced. The data storage material layer 54 remains in this state until a second voltage $V_2$ ($V_2 > V_1$) is applied. That is, the resistance of the data storage material 54 is dramatically increased while a voltage in the range of $\Delta V$ ($V_1 \sim V_2$) is applied to the data storage material layer 54. Then, as the voltage applied to the data storage material layer 54 increases beyond the second voltage $V_2$, the resistance of the data storage material layer 54 dramatically decreases. In this case, the change of the drain current Id is the same as the change occurring when the first voltage $V_1$ is applied to the data storage material 54. The change of the drain current Id of the data storage material layer 54 is proportional to the applied voltage and is the same as when a voltage lower than the first voltage $V_1$ is applied thereto.

The current of the data storage material layer 54 varies depending on a voltage applied thereto, i.e., whether the voltage applied thereto is greater or smaller than the first voltage $V_1$.

In particular, when a third voltage $V_3$ ($V_3 > V_2$) is applied to the data storage material layer 54 so that the data storage material layer 54 has a first resistance, and a voltage smaller than the first voltage $V_1$ is applied to the data storage material layer 54, the data storage material layer 54 has a current (resistance) value as illustrated in the first graph G1 (hereinafter, this is called the first case).

On the other hand, when a predetermined voltage V ($V_1 \leq V \leq V_2$) is applied so that the data storage material layer 54 has a second resistance, which is greater than the first resistance, as illustrated in FIG. 4, and a voltage smaller than the first voltage $V_1$ is applied to the data storage material layer 54, the data storage material layer 54 has a current value as illustrated in the second graph G2 (hereinafter, this is called the second case).

The current measured at the predetermined voltage in the second case is much less than that measured in the first case. The resistance is much larger in the second case. This means that these two different currents can be measured from the data storage material layer 54 at a predetermined voltage smaller than the first voltage $V_1$. The two current values respectively correspond to data "0" and "1" written in the data storage material layer 54.

The first case corresponds to data "1" being stored in the data storage material layer 54 and the second case corresponds to data "0" being stored in the data storage material layer 54.

The data values "0" and "1" for the first and second cases are optionally designated. That is, the first case may correspond to data "0" being stored in the data storage material layer 54, and the second case may correspond to data "1" being stored in the data storage material layer 54.

When the data storage material layer is the $TiO_2$ layer, the voltage-current characteristics of the data storage material layer 54 differ from the voltage-current characteristics illustrated in FIG. 4.

Referring to FIG. 5, third and fifth graphs G3 and G5 illustrate voltage-current characteristics when a negative voltage, that is, a voltage smaller than a fifth voltage $V_5$ ($=V=\geq=V_5=>0$), is applied to the data storage unit S and the resistance of the data storage material layer 54 dramatically decreases. Fourth and sixth graphs G4 and G6 illustrate voltage-current characteristics when a positive voltage, that is, one larger than a fourth voltage V4 ($V \geq V4 \geq 0$), is applied to the data storage unit S and the resistance of the data storage material layer 54 dramatically increases.

Referring to FIG. 5, after a voltage larger than the fourth voltage $V_4$ is applied to the data storage unit S, the voltage-current characteristics of the data storage material layer 54 become those illustrated in the fourth graph G4 when the voltage is positive and become those illustrated in the sixth graph G6 when the voltage is negative. Thus, after a voltage that is higher than the fourth voltage $V_4$ is applied to the data storage unit S, the data storage material layer 54 maintains a high resistance until the fifth voltage $V_5$ is applied to the data storage unit S (hereinafter, this is called the third case).

Furthermore, referring to the third and fifth graphs G3 and G5, after a voltage smaller than the fifth voltage $V_5$ is applied to the data storage unit S, the voltage-current characteristics of the data storage material layer 54 become those illustrated in the fifth graph G5 when the voltage is negative and those illustrated in the third graph G3 when the voltage is positive. Thus, after a voltage smaller than the fifth voltage $V_5$ is applied to the data storage unit S, the data storage material layer 54 maintains a low resistance until the fourth voltage $V_4$ is applied to the data storage unit S (hereinafter, this is called the fourth case).

In the third and fourth cases, the data storage material layer 54 has two different currents (or resistances) in the range between the fifth voltage $V_5$ and the fourth voltage $V_4$. This means that the data storage material layer 54 has the two different states in the above voltage range and one of the two different states may correspond to data "1" and the other may correspond to data "0" being stored in the data storage material layer 54.

The two states of the data storage material layer 54 are determined as a voltage larger than the fourth voltage $V_4$ or smaller than the fifth voltage $V_5$ is applied to the data storage unit S. However, since the voltage applied to the data storage material layer 54 to detect these states is smaller than the fourth voltage $V_4$ or larger than the fifth voltage $V_5$, the data storage material layer 54 maintains its initial state even after the state is detected. That is, data stored in the data storage material layer 54 is maintained even after the pertinent data is read.

Figure 6:
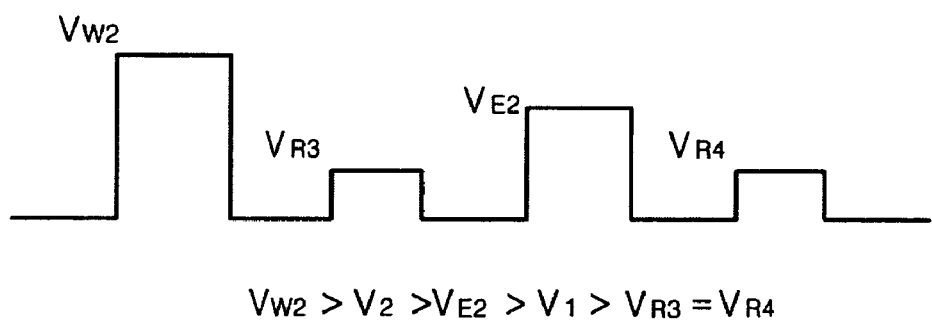
FIG. 6 is a drawing illustrating a voltage pulse applied to the nonvolatile memory device of FIG. 1 when a data storage material layer is an NiO layer.
Figure 7:
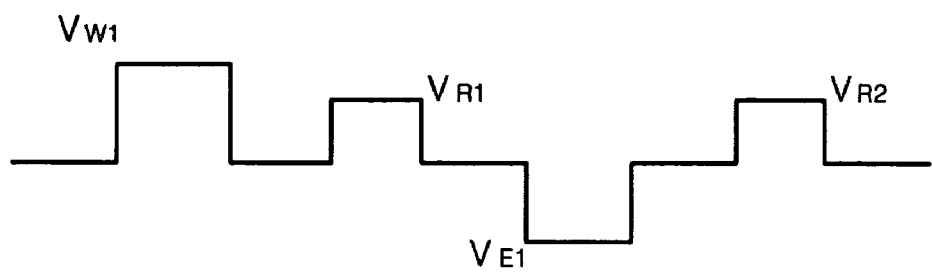
FIG. 7 illustrates a voltage pulse applied to the nonvolatile memory device of FIG. 1 when a data storage material layer is a $TiO_2$ layer.

FIGS. 6 and 7 illustrate examples of voltage pulses applied to the data storage unit S to write data in the data storage material layer 54 and read or erase the data written in the data storage material layer 54.

In particular, FIG. 6 illustrates a voltage pulse applied to the data storage material layer 54 when it is a NiO layer and FIG. 7 illustrates a voltage pulse applied to the data storage material layer 54 when it is a $TiO_2$ layer.

Referring to FIG. 6, a second write voltage pulse $V_{w2}$ is applied to the data storage material layer 54 in order to write data, for example "1", in the data storage material layer 54. The second write voltage pulse $V_{W2}$ has a value corresponding to the third voltage $V_3$ of FIG. 4. A third read voltage pulse $V_{R3}$ is applied to the data storage material layer 54 to read the data "1" stored in the data storage material layer 54. The third read voltage pulse $V_{R3}$ has a voltage that is lower than the first voltage $V_1$ of FIG. 4.

Referring to the first graph of FIG. 4, when the third voltage $V_3$ is applied to the data storage material layer 54, the resistance of the data storage material layer 54 is in a low state. This low state is maintained when a voltage smaller than the first voltage $V_1$ is applied to the data storage material layer 54. Thus, when the third read voltage pulse $V_{R3}$, which is smaller than the first voltage $V_1$, is applied to the data storage material layer 54, a current through the data storage material layer 54 is a lot larger than the current when a voltage between the first voltage $V_1$ and the second voltage $V_2$ is applied to the data storage material layer 54. This result reveals that the data "1" is written in the data storage material layer 54.

A third write voltage pulse $V_{E2}$ is applied to the data storage material layer 54 in order to write data, for example "0", in the data storage material layer 54. The third write voltage pulse $V_{E2}$ has a voltage between the first and second voltages $V_1$ and $V_2$. Therefore, when the third write voltage pulse $V_{E2}$, that is smaller than the second write voltage pulse $V_{w2}$, is applied to the data storage material layer 54, the resistance of the data storage material layer 54 dramatically increases (see FIG. 4). The data storage material layer 54 remains in this state when a voltage pulse applied to the data storage material layer 54 is lower than the first voltage $V_1$ (see the second graph G2 of FIG. 4).

A fourth read voltage pulse $V_{R4}$ is applied to the data storage material layer 54 to read "0" from the data storage material layer 54. The fourth read voltage pulse $V_{R4}$ has a voltage that is lower than the first voltage $V_1$ of FIG. 4. In addition, since the data "0" is read when the fourth read voltage pulse $V_{R4}$ is applied to the data storage material layer 54, the current measured from the data storage material layer 54 is a lot smaller than the current measured when the data "1" is read.

The data stored in the data storage material layer 54 is erased by simply applying a voltage pulse that has an opposite polarity to one applied when writing the data to the data storage unit S.

Referring to FIG. 7, a first write voltage pulse $V_{W1}$ is applied to the data storage material layer 54 in order to write a predetermined data, for example "1", in the data storage material layer 54. A first read voltage pulse $V_{R1}$ is applied to the data storage unit S to read the data "1" stored in the data storage material layer 54 by applying the first write voltage pulse $V_{W1}$. The first read voltage pulse $V_{R1}$, which is lower than the first write voltage pulse $V_{W1}$, has a voltage higher than zero and lower than fourth voltage $V_4$.

As described above, although the first read voltage pulse $V_{R1}$ is applied to the data storage material layer 54, the resistance characteristics of the data storage material layer 54 do not change since the first read voltage pulse $V_{R1}$ has a voltage that not only is lower than the first write voltage pulse $V_{W1}$, but also has the same polarity as the first write voltage pulse $V_{W1}$. Thus, although the first read voltage pulse $V_{R1}$ is applied to the data storage material layer 54, the data written in the data storage material layer 54 is not damaged and destroyed.

As described above, when the data storage material layer 54 is the $TiO_2$ layer, the resistance of the data storage material layer 54 at the fifth voltage $V_5$ dramatically decreases. Accordingly, the fifth voltage $V_5$ can be used to erase the data written in the data storage material layer 54 by applying the first write voltage pulse $V_{W1}$.

Referring to FIG. 7, $V_{E1}$ denotes a first erase voltage pulse corresponding to the fifth voltage $V_5$. If the first erase voltage pulse $V_{E1}$ ($=V_{E1}=>V_{R1}$) is applied to the data storage material layer 54, the resistance of the data storage material layer 54 is dramatically decreased and the data written in the data storage material layer 54 is erased. When the resistance of the data storage material layer 54 is low, it is assumed that data "0" is written in the data storage material layer 54. In this case, the first erase voltage pulse $V_{E1}$ can be considered to be a writing voltage applied to write data "0" in the data storage material layer 54.

A second read voltage pulse $V_{R2}$ is applied to the data storage material layer 54 to read data "0" from the data storage material layer 54. The second read voltage pulse $V_{R2}$ is lower than an absolute value of the voltage of the first erase voltage pulse $V_{E1}$ ($V_{R2} \leq V_{E1}=$). In this case, although the second read voltage pulse $V_{R2}$ is applied after the first erase voltage pulse $V_{E1}$ is applied to the data storage material layer 54, the data storage material layer 54 maintains the resistance after the first erase voltage pulse $V_{E1}$ is applied.

As described above, the data storage material layer 54 has a different current value depending on the voltage applied thereto to write data. Accordingly, the data written in the data storage material layer 54 can be precisely read. In addition, since a voltage applied to read data from the data storage material layer 54 is lower than the voltage applied to write data thereto, the data state of the data storage material layer 54 can be maintained constantly even after the data is read. Thus, a refresh process that is conducted in the conventional memory device after data reading is not required.

Figure 8:
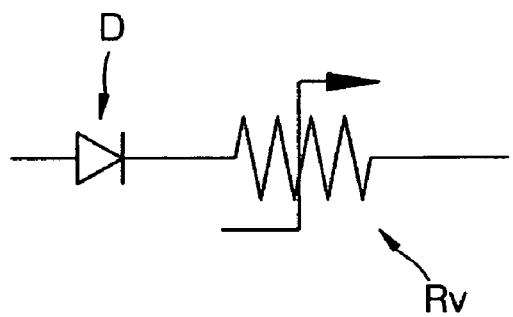
FIG. 8 is a circuit diagram illustrating a case where a transistor is replaced with a diode in the circuit of FIG. 2.

Meanwhile, a transistor Tr used as a switching device in FIG. 2 can be substituted with other switching devices, for instance, a diode, as illustrated in FIG. 8. FIG. 8 is a circuit diagram of a nonvolatile memory device comprising one diode D and one variable resistant material Rv, that is, 1D-1R.

A method of manufacturing the nonvolatile memory device of FIG. 1 will now be explained with reference to FIG. 9.

Figure 9:
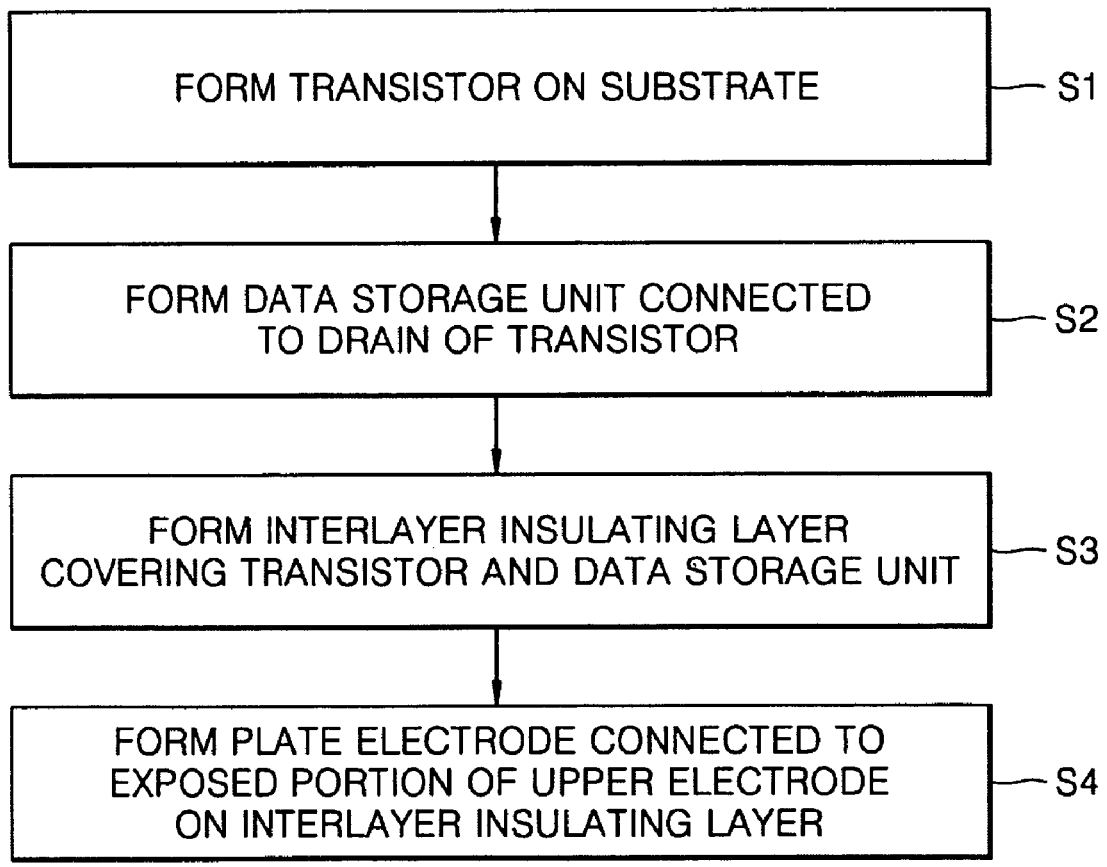
FIG. 9 is a block diagram illustrating a method of manufacturing the nonvolatile memory device of FIG. 1 according to an order of a process performed.

Referring to FIGS. 1 and 9, a transistor is formed on the substrate 40 in step S1. In step S2, the data storage unit S connected to the drain 44 of the transistor is formed on the substrate 40 by sequentially forming the lower electrode 52, the data storage material layer 54, and the upper electrode 56 on the drain 44 of the substrate 40. The data storage material layer 54 may be formed of a transition metal oxide layer having a resistance that varies according to the applied voltage. For instance, a NiO, $V_2O_5$, ZnO, $Nb_2O_5$, $TiO_2$, $WO_3$, or CoO layer may be used. In step S3, the interlayer insulating layer 60 covering the transistor and the data storage unit S is formed on the substrate 40. In step S4, the upper electrode of the data storage unit S is exposed and the plate electrode 58 is formed on an exposed portion of the upper electrode 56 of the data storage unit S and the interlayer insulating layer 60. When the data storage material layer 54 is formed of a NiO layer, the plate electrode 58 may be substituted with a plate pad that contacts all upper electrodes included in data storage units of all cells (not shown).

Referring to FIG. 3, after the first interlayer insulating layer 62 is formed between the data storage unit S and the substrate 40 and the contact hole h1 that exposes the drain 44 is formed in the first interlayer insulating layer 62, the contact hole h1 may be filled with the conductive plug 64. Additionally, the data storage unit S contacting the conductive plug 64 may be formed on the first interlayer insulating layer 62.

Also, the lower electrode 52 and the data storage material layer 54 may be formed in a non-stack type rather than a stack type.

Although it is not illustrated in the drawings, after forming a diode on the substrate 40, the data storage unit S connected to the diode may be formed on the substrate 40. The data storage unit S may be formed in the same way as described above.

As described above, according to the exemplary embodiments of the present invention, the nonvolatile memory device, including 1T-1R or 1D-1R, comprises a transition metal oxide layer, which has the voltage-current characteristic as illustrated in FIG. 4 and is easy to process, as the resistant material in which the data is stored. Therefore, the conventional DRAM manufacturing process can be used and an increased productivity along with lowered production costs can be achieved. Furthermore, memory characteristics of the resistant material do not change even though the size of the resistant material is reduced due to a high integration density. This is because that the data is written or read using changes in resistance of the resistant material. Also, because data written in the resistant material is read non-destructively, the state of the resistant material remains constant even after the data is read and a lower operation voltage is applied. Thus, a refresh process that is conducted in the conventional memory device after data reading is not required.

Although the present invention is fully explained here, the invention may, however, be embodied in many different forms and should not be construed as being limited to the embodiments set forth herein; rather these embodiments are provided so that this disclosure will be thorough and complete, and will fully convey the concept of the invention to those skilled in the art. For instance, instead of the transition metal oxide layer which is used as the data storage material layer 54, another material layer that has the voltage-current characteristic that the data is not destroyed or damaged after data reading may be used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a substrate;
   a diode with a switching function formed on the substrate; and
   a data storage unit connected to the diode, wherein the data storage unit includes a nonvolatile, unipolar data storage material layer having different and reversible resistance characteristics in different voltage ranges,
   wherein the nonvolatile, unipolar data storage material layer has a first resistance when a write voltage $V_3 (V_3 > V_2)$ is applied to the nonvolatile, unipolar data storage material layer, the first resistance representing a first data state,
   wherein the nonvolatile, unipolar data storage material layer has a second resistance different from the first resistance when a write voltage $V_{w1} (0 < V_1 < V_{w1} < V_2)$ is applied to the nonvolatile, unipolar data storage material layer, the second resistance representing a second data state, and
   wherein the first and second data states are readable from the nonvolatile, unipolar data storage material layer by application of a read voltage $V_R (V_R < |V_1|)$ to the nonvolatile, unipolar data storage material layer without altering the data state of the nonvolatile, unipolar data storage material layer,
   wherein $V_1$ is a first voltage, and
   wherein $V_2$ is a second voltage.

2. The nonvolatile memory device of claim 1, wherein the data storage unit includes an upper electrode formed on the nonvolatile, unipolar data storage material layer and a lower electrode on which the nonvolatile, unipolar data storage material layer is formed.

3. The nonvolatile memory device of claim 1, wherein the nonvolatile, unipolar data storage material layer is a transition metal oxide layer whose resistance dramatically increases in a predetermined voltage range.

4. The nonvolatile memory device of claim 3, wherein the transition metal oxide layer is one of NiO, $V_2O_5$, ZnO, $Nb_2O_5$, $TiO_2$, $WO_3$, and CoO layers.

5. The nonvolatile memory device of claim 3, wherein the data storage unit includes an upper electrode formed on the nonvolatile, unipolar data storage material layer and a lower electrode on which the nonvolatile, unipolar data storage material layer is formed.

6. The nonvolatile memory device of claim 1, wherein the first resistance of the nonvolatile, unipolar data storage material layer corresponds to data "0" and the second resistance of the nonvolatile, unipolar data storage material layer corresponds to data "1".

7. The nonvolatile memory device of claim 2, further comprising:
   a voltage applicator configured to apply the write voltage $V_{w1}$ and the read voltage $V_R$ between the upper electrode and the lower electrode of the data storage unit.

8. The nonvolatile memory device of claim 5, further comprising:
   a voltage applicator configured to apply the write voltage $V_{w1}$ and the read voltage $V_R$ between the upper electrode and the lower electrode of the data storage unit.

* * * * *